(12) United States Patent
Yun et al.

(10) Patent No.: US 10,198,974 B2
(45) Date of Patent: Feb. 5, 2019

(54) DISPLAY DEVICE AND METHOD OF MANUFACTURING THE SAME

(71) Applicant: SAMSUNG DISPLAY CO., LTD., Yongin-si, Gyeonggi-Do (KR)

(72) Inventors: Jong Hyun Yun, Gwangmyeong-si (KR); Sang Cheon Han, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/785,822

(22) Filed: Oct. 17, 2017

(65) Prior Publication Data

US 2018/0130966 A1 May 10, 2018

(30) Foreign Application Priority Data

Oct. 17, 2016 (KR) .................. 10-2016-0134157

(51) Int. Cl.
| | | |
|---|---|---|
| *G09F 9/30* | (2006.01) | |
| *G09F 9/33* | (2006.01) | |
| *G06F 1/16* | (2006.01) | |
| *H01L 27/32* | (2006.01) | |
| *H01L 51/00* | (2006.01) | |
| *H01L 51/52* | (2006.01) | |

(52) U.S. Cl.
CPC ............ *G09F 9/301* (2013.01); *G06F 1/1652* (2013.01); *G09F 9/33* (2013.01); *H01L 27/3246* (2013.01); *H01L 27/3276* (2013.01); *H01L 51/0097* (2013.01); *H01L 51/5237* (2013.01); *B32B 2457/20* (2013.01); *B32B 2457/206* (2013.01); *H01L 2227/326* (2013.01); *H01L 2251/5338* (2013.01)

(58) Field of Classification Search
CPC .......... G09F 9/301; G09F 9/33; G06F 1/1652; H01L 27/32; H01L 51/0097; H01L 27/3246; H01L 27/3276; H01L 51/5237; H01L 2227/326; H01L 2251/5338; B32B 2457/206

See application file for complete search history.

(56) References Cited

U.S. PATENT DOCUMENTS 9,532,431 B2    12/2016  Yun
2010/0259166 A1*  10/2010  Cok ................... H01L 27/3255
                                              313/506

(Continued)

FOREIGN PATENT DOCUMENTS

KR    10-2011-0023138    3/2011
KR    10-2012-0042151    5/2012

(Continued)

*Primary Examiner* — Scott B Geyer
(74) *Attorney, Agent, or Firm* — F. Chau & Associates, LLC

(57) ABSTRACT

A display device includes a base substrate layer including a first base substrate and a second base substrate separated from the first base substrate in a first direction, a flexible film disposed on a first surface of the base substrate layer, and one or more light emitting elements disposed on a first surface of the flexible film. The flexible film includes a flat portion and a bent portion. The bent portion is inserted into a space between the first base substrate and the second base substrate.

15 Claims, 10 Drawing Sheets

(56) References Cited

U.S. PATENT DOCUMENTS

| | | | | |
|---|---|---|---|---|
| 2016/0035801 A1* | 2/2016 | Kim | ................... | H01L 27/3244 |
| | | | | 257/40 |
| 2016/0295685 A1* | 10/2016 | Ryu | ...................... | G06F 1/1652 |
| 2017/0052422 A1* | 2/2017 | Kazlas | .................... | G02F 1/167 |
| 2017/0270835 A1* | 9/2017 | Yang | ........................ | G09F 9/30 |
| 2017/0290106 A1* | 10/2017 | Kim | ....................... | H05B 33/04 |
| 2017/0294425 A1* | 10/2017 | Kim | ..................... | H01L 25/167 |
| 2018/0011576 A1* | 1/2018 | Ryu | ..................... | G06F 1/1652 |
| 2018/0145269 A1* | 5/2018 | Myeong | ............... | G06F 1/1652 |

FOREIGN PATENT DOCUMENTS

| | | |
|---|---|---|
| KR | 10-2015-0060161 | 6/2015 |
| KR | 10-2015-0133337 | 11/2015 |
| KR | 10-2016-0016267 | 2/2016 |
| KR | 10-2016-0095310 | 8/2016 |

* cited by examiner

DISPLAY DEVICE AND METHOD OF MANUFACTURING THE SAME

This application claims priority under 35 U.S.C. § 119 to Korean Patent Application No. 10-2016-0134157, filed on Oct. 17, 2016, in the Korean Intellectual Property Office, the disclosure of which is incorporated by reference herein in its entirety.

TECHNICAL FIELD

The present invention relates to a display device, and more particularly, to a bendable display device and a method of manufacturing the same.

DISCUSSION OF THE RELATED ART

Display devices are devices that display visual data. Examples of the display devices include cathode ray display devices, liquid crystal display devices, organic light-emitting display devices, electrophoretic display devices, etc.

A display device that uses a self-luminous element, such as an organic light-emitting display device, does not require a separate light source. Therefore, an organic light-emitting display device can have a simple structure, small thickness and low weight. For example, an organic light-emitting display device can be made small and light. In addition, an organic light-emitting display device may have a wide viewing angle, superior contrast, high response speed, good luminance characteristics, and low power consumption.

An organic light-emitting display device may be foldable or rollable.

SUMMARY

According to an exemplary embodiment of the present invention, a display device includes a base substrate layer including a first base substrate and a second base substrate separated from the first base substrate in a first direction, a flexible film disposed on a first surface of the base substrate layer, and one or more light emitting elements disposed on a first surface of the flexible film. The flexible film includes a flat portion and a bent portion. The bent portion is inserted into a space between the first base substrate and the second base substrate.

According to an exemplary embodiment of the present invention, a method of manufacturing a display device includes preparing a carrier substrate, disposing a flexible film on a first surface of the carrier substrate, disposing a light emitting element on a first surface of the flexible film, disposing a shrinkable film on the light emitting element, removing the carrier substrate, disposing a base substrate layer on a second surface of the flexible film, the base substrate layer including an opening, and shrinking the shrinkable film.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
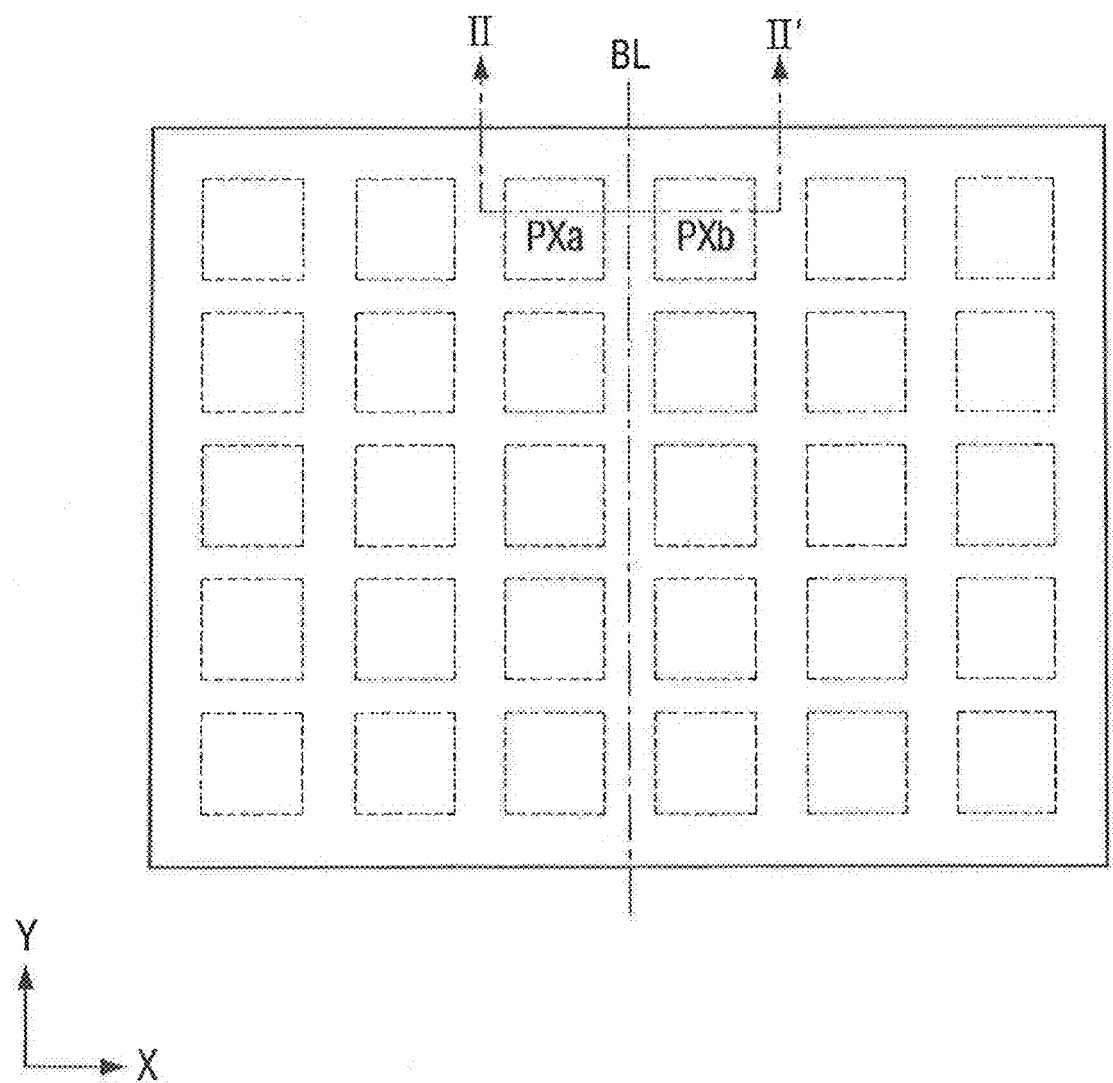
FIG. 1 is a plan view illustrating a display device according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. The sizes or proportions of elements illustrated in the drawings may be exaggerated for clarity.

It will be understood that when an element such as a layer or substrate is referred to as being "on" another element, it can be directly on the other element, or intervening elements may also be present therebetween.

Figure 2:
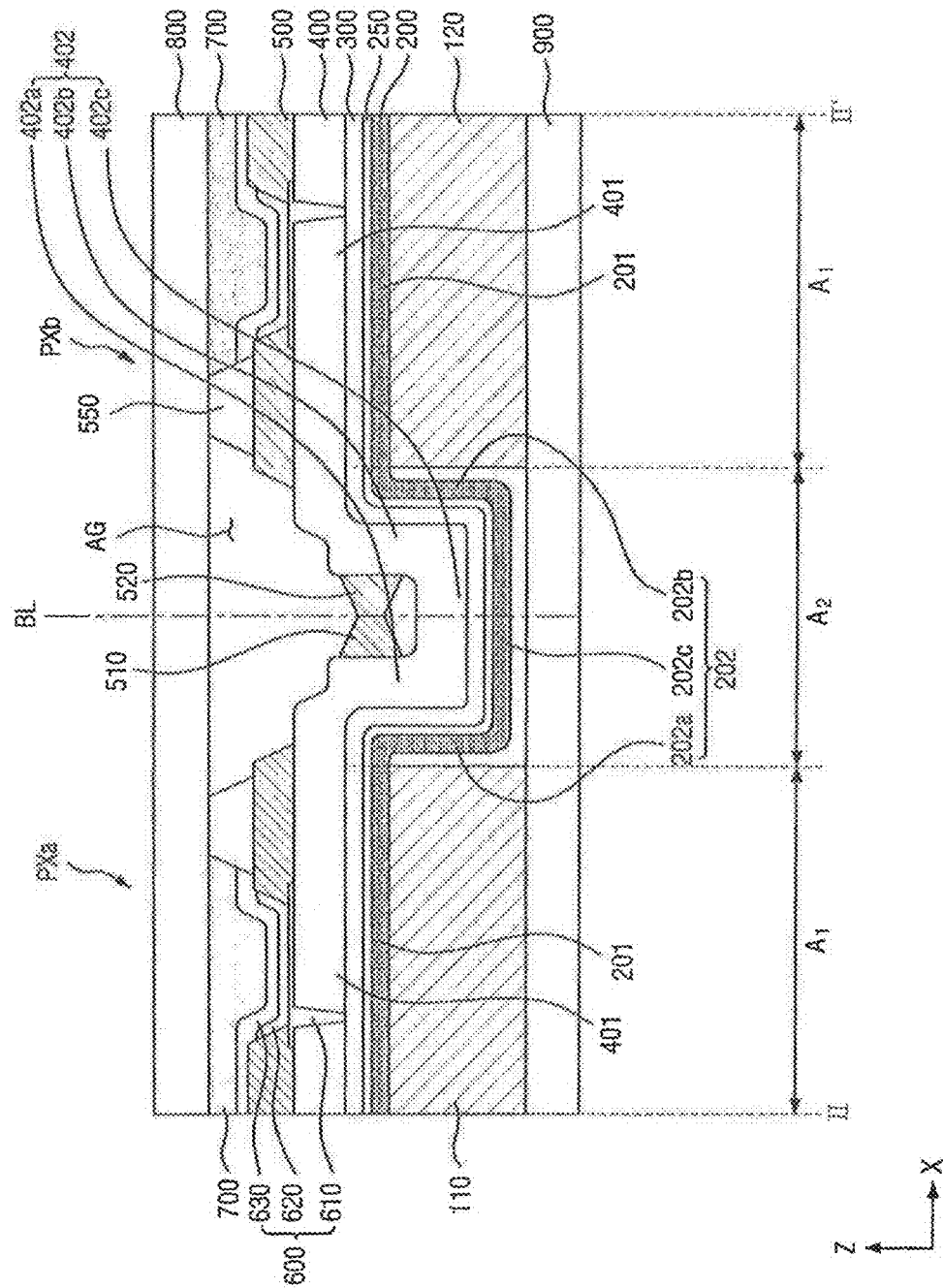
FIG. 2 is a cross-sectional view taken along line II-II' of FIG. 1, illustrating the display device of FIG. 1 in a flat state, according to an exemplary embodiment of the present invention.

FIG. 1 is a plan view illustrating a display device according to an exemplary embodiment of the present invention. FIG. 2 is a cross-sectional view taken along line II-II' of FIG. 1, illustrating the display device of FIG. 1 in a flat state, according to an exemplary embodiment of the present invention.

In the specification, a first direction X may cross a second direction Y. A third direction Z may cross a plane formed by the first direction X and the second direction Y. For example, the third direction Z may cross an XY plane.

Referring to FIGS. 1 and 2, a display device includes a plurality of pixels PX (e.g., a first pixel PXa and a second pixel PXb). Each of the pixels PX may display a color such that an image may be displayed by the display device. The pixels PX may be repeatedly arranged in the first direction X and the second direction Y in a matrix form on a plane. For example, the pixels PX may include the first pixel PXa and second pixel PXb disposed adjacent to the first pixel PXa in the first direction X. In an exemplary embodiment of the present invention, a bending line BL may be located between the first pixel PXa and the second pixel PXb. The bending line BL refers to a line along which the display device may be bent.

The display device may include a base substrate layer (110 and 120), a flexible film 200 disposed on a first surface of the base substrate layer (110 and 120), and a light-emitting element 600 disposed on a first surface of the flexible film 200. The display device may further include an encapsulation layer 700 disposed on the light-emitting element 600, an encapsulating substrate 800 facing the base substrate layer (110 and 120), and an elastic film 900 disposed on a second surface of the base substrate layer (110 and 120). In FIG. 2, the display device is in a flat state.

The base substrate layer (110 and 120) includes a first base substrate 110 and a second base substrate 120 spaced apart from the first base substrate 110 in the first direction X. In the specification, the phrase "a plane" may refer to the XY plane.

The base substrate layer (110 and 120) may be a transparent or an opaque support member. For example, the base substrate layer (110 and 120) may be a polymer film. The first base substrate 110 and the second base substrate 120 may include the same material. The first base substrate 110 and the second base substrate 120 may be at least partially separated from each other. The bending line BL may be located in the space between the first base substrate 110 and the second base substrate 120. In an exemplary embodiment of the present invention, the bending line BL may extend in the second direction Y at the space between the first base substrate 110 and the second base substrate 120. Although one bending line BL is illustrated in FIG. 2, a plurality of bending lines BL extending in the second direction Y and separated from each other in the first direction X can also be provided. For example, the display device of FIG. 1 may be bent along a bending line BL between any two neighboring pixels PX, the bending BL extending in the second direction Y.

The flexible film 200 is disposed on the base substrate layer (110 and 120). The flexible film 200 may be flexible and transparent or opaque. In an exemplary embodiment of the present invention, the flexible film 200 includes a plastic. For example, the flexible film 200 may include polyimide, polycarbonate, polyethersulphone, polyethylene terephthalate, and/or polyacrylate.

The flexible film 200 includes flat portions 201 in first areas $A_1$, where pixel units are formed, and a bent portion 202 (the bent portion 202 including elements 202a, 202b and 202c, described in detail below) located in a second area $A_2$, where the bending line BL is located. In an exemplary embodiment of the present invention, the bent portion 202 of the flexible film 200 may be convex (e.g., convex when seen through the elastic film 900) toward the base substrate layer (110 and 120). Although one bent portion 202 is illustrated in FIG. 2, a plurality of bent portions 202, separated from each other in the first direction X, may also be provided.

The flat portions 201 of the flexible film 200 may overlap the first base substrate 110 and the second base substrate 120. Thus, each of the flat portions 201 may have substantially flat first and second surfaces. For example, the flat first surface of a flat portion 201 may be opposite to the flat second surface of the flat portion 201. A light emitting element 600 may be disposed on each of the flat portions 201 of the flexible film 200.

At least part of the bent portion 202 of the flexible film 200 may be inserted into the space between the first base substrate 110 and the second base substrate 120. For example, the bent portion 202 may have a 'U'-shaped structure. The bent portion 202 of the flexible film 200 may include a first inclined portion 202a, which is connected to a flat portion 201 and may be sloped downward along the first direction X (e.g., downward from a left side toward a right side in the drawing), a second inclined portion 202b, which is connected to a flat portion 201 and may be sloped upward along the first direction X, and a valley 202c, which is located between the first inclined portion 202a and the second inclined portion 202b. The flexible film 200 may be bent between the flat portion 201 and the first inclined portion 202a or between the flat portion 201 and the second inclined portion 202b. An angle of about 90 degrees or more may be formed between the second surface (a lower surface in the drawing) of the flat portion 201 and a second surface (a lower surface in the drawing) of the first inclined portion 202a or between the second surface of the flat portion 201 and a second surface of the second inclined portion 202b. The valley 202c of the bent portion 202 of the flexible film 200 may have a relatively flat surface or it may be concave when seen through the elastic film 900. It is to be understood that the first inclined portion 202a and/or the second inclined portion 202b may be at least partially curved or bent.

In an exemplary embodiment of the present invention, at least part of the second surface (the lower surface in the drawing of the first inclined portion 202a may face a sidewall of the first base substrate 110, and at least part of the second surface (the lower surface in the drawing) of the second inclined portion 202b may face a sidewall of the second base substrate 120. The second surface of the first inclined portion 202a may contact the sidewall of the first base substrate 110 or the second surface of the first inclined portion 202a may be separated from the sidewall of the first base substrate 110. In addition, the second surface of the second inclined portion 202b may contact the sidewall of the second base substrate 120 or the second surface of the second inclined portion 202b may be separated from the sidewall of the second base substrate 120. In addition, a first surface (an upper surface in the drawing) of the first inclined portion 202a and a first surface (an upper surface in the drawing) of the second inclined portion 202b may at least partially face each other (e.g., partially overlap each other in the YZ plane. Since the second surface of the first inclined portion 202a and the sidewall of the first base substrate 110 face each other, the second surface of the second inclined portion 202b and the sidewall of the second base substrate 120 face each other, and the first surface of the first inclined portion 202a and the first surface of the second inclined portion 202b face each other, a structure, in which the bent portion 202 of the flexible film 200 is inserted into the space between the first base substrate 110 and the second base substrate 120, may be formed. Accordingly, the structure might not be damaged even when repeatedly bending the display device. In addition, since the bending line BL is located in the bent portion 202, inserted into the space between the first base substrate 110 and the second base substrate 120, structural deformation of other portions of the display device may be reduced when the display device is bent.

A first surface (an upper surface in the drawing) of the valley 202c may be located at a lower level than the first surface (the upper surface in the drawing) of the base substrate layer (110 and 120). For example, the first surface of the valley 202c may be disposed between the elastic film 900 and the first surface of the base substrate layer (110 and 120). In an exemplary embodiment of the present invention, a second surface (a lower surface in the drawing) of the valley 202c may be located at a higher level than the second surface (the lower surface in the drawing) of the base substrate layer (110 and 120). For example, the second surface of the valley 202c may be disposed between the first and second surfaces of the base substrate layer (110 and 120). Thus, the valley 202c may be disposed between the first and second surfaces of the base substrate layer (110 and 120). Since the second surface of the valley 202c is located at a higher level than the second surface of the base substrate layer (110 and 120), additional components such as the elastic film 900 can be disposed on the second surface of the base substrate layer (110 and 120), and the bent portion 202 of the flexible film 200 can be prevented from being exposed when the display device is bent.

A barrier layer 250 may be disposed on the flexible film 200. The barrier layer 250 may prevent impurities such as moisture and oxygen from penetrating into the display device. The barrier layer 250 may include silicon oxynitride (SiON) and/or silicon oxide ($SiO_x$). A metal wiring layer 300 may be disposed on the barrier layer 250. The metal wiring layer 300 may include a switching element, a driving element, a gate line, a data line, and an insulating layer interposed between these components. Each of the barrier layer 250 and the metal wiring layer 300 may have flat portions and a bent portion. The bent portion of each of the barrier layer 250 and the metal wiring layer 300 may have a shape corresponding to a shape of the bent portion 202 of the flexible film 200. For example, the bent portion of the barrier layer 250 and the bent portion of the metal wiring layer 300 may be inserted into the space between the first base substrate 110 and the second base substrate 120.

In an exemplary embodiment of the present invention, a neutral plane may be located within the metal wiring layer 300 at the position of the bending line BL. For example, the neutral plane may be located in the metal wiring layer 300 at a position overlapping the space between the first base substrate 110 and the second base substrate 120. Since the neutral plane is located in the metal wiring layer 300, even if a bending operation of the display device is repeatedly performed, the damage to the metal wiring layer 300, which may be negatively affected when subjected to compressive stress and/or tensile stress, may be reduced, and a disconnection of the gate line or the data line may be prevented. In addition, in a display device, according to an exemplary embodiment of the present invention, a portion (e.g., the second area $A_2$) of the display device where relatively large structural deformation occurs is inserted into the space between the first base substrate 110 and the second base substrate 120. Therefore, even when the overall thickness of the display device is changed by the placement of additional components in an upper part and/or a lower part of the display device, the position of the neutral plane in the bending line BL may be maintained. Thus, the display device may have increased durability against bending and may operate reliably under repeated bending/straightening.

An interlayer insulating film 400 may be disposed on the metal wiring layer 300. The interlayer insulating film 400 includes flat portions 401 located in the first areas $A_1$ and a bent portion 402 located in the second area $A_2$. The flat portions 401 and the bent portion 402 of the interlayer insulating film 400 may have shapes corresponding to those of the flat portions 201 and the bent portion 202 of the flexible film 200, respectively. For example, the bent portion 402 of the interlayer insulating film 400 may include a first inclined portion 402a, which is connected to a flat portion 401 and may slope downward along the first direction X, a second inclined portion 402b which is connected to a flat portion 401 and may slope upward along the first direction X, and a valley 402c which is located between the first inclined portion 402a and the second inclined portion 402b. At least part of the bent portion 402 of the interlayer insulating film 400 may be inserted into the space between the first base substrate 110 and the second base substrate 120.

The light emitting element 600 may be disposed on the interlayer insulating film 400 of each of the first areas $A_1$. The light emitting element 600 may be, for example, an organic light emitting element. The light emitting element 600 includes a lower electrode 610 disposed on the interlayer insulating film 400, a light emitting layer 620 disposed on the lower electrode 610, and an upper electrode 630 disposed on the light emitting layer 620. The lower electrode 610 may be an anode, and the upper electrode 630 may be a cathode. The lower electrode 610 may be connected to the metal wiring layer 300, for example, to the switching element of the metal wiring layer 300 via a through hole. The through hole may be formed in the interlayer insulating film 400. One or more organic layers such as a hole injecting layer, a hole transporting layer, an electron injecting layer, and/or an electron transporting layer may be formed between the lower electrode 610 and the light emitting layer 620, and between the light emitting layer 620 and the upper electrode 630.

A pixel defining layer 500 may be disposed on the interlayer insulating film 400. For example, the pixel defining layer 500 may be disposed on first surfaces of the flat portions 401 of the interlayer insulating film 400. The pixel defining layer 500 may include a plurality of pixel areas arranged in a substantially lattice shape. The pixel areas may be openings in the pixel defining layer 500, where the pixels PX are disposed. The pixel defining layer 500 may include an insulating material such as benzocyclobutene or polyimide. The pixel defining layer 500 may expose the lower electrode 610 at least partially. In addition, the light emitting layer 620 and the upper electrode 630 may at least partially overlap the pixel defining layer 500.

A first pattern portion 510 and a second pattern portion 520 may be disposed on the interlayer insulating film 400. For example, the first pattern portion 510 may be disposed on a first surface of the first inclined portion 402a, and the second pattern portion 520 may be disposed on a first surface of the second inclined portion 402b. Each of the first pattern portion 510 and the second pattern portion 520 may extend in the second direction Y. The first pattern portion 510 and the second pattern portion 520 may face and contact each other at least partially. The first pattern portion 510 and the second pattern portion 520 may include the same material as the pixel defining layer 500. The first pattern portion 510 and the second pattern portion 520 may be formed through an integral process.

Spacers 550 may be disposed on the pixel defining layer 500. The spacers 550 may maintain a distance between the light emitting elements 600 and the encapsulation substrate 800. The spacers 550 may include the same material as the pixel defining layer 500 or a material that is different from a material included in the pixel defining layer 500.

The encapsulation layer 700 may be disposed on the light emitting elements 600. For example, the encapsulation layer 700 may be disposed in areas surrounded by the light emitting elements 600, the spacers 550, and the encapsulation substrate 800. The encapsulation layer 700 may prevent impurities such as moisture and oxygen from penetrating from the outside of the display device. The encapsulation layer 700 may include an organic material and/or an inorganic material. In addition, the encapsulation layer 700 may include a plurality of stacked layers. The encapsulation substrate 800 may be disposed on the encapsulation layer 700 and the spacers 550 to seal the display device. The encapsulation substrate 800 may contact the spacers 550.

An air layer AG (e.g., a space filled with air or a vacuum space) may be disposed in a space surrounded by the encapsulation substrate 800, the spacers 550, the pixel defining layer 500, and the interlayer insulating film 400. For example, the air layer AG, not the encapsulation layer 700, may be disposed in the space overlapping the second area. $A_2$. The bent portion is located in the second area $A_2$. Thus, due to the air layer AG, the structural deformation of components disposed on the bent portion 202 of the flexible film 200 may be facilitated when the display device is bent along the bending line BL. In addition, the air layer AG may prevent or reduce a decrease in the durability of the display device when a bending operation of the display device is repeatedly performed.

The elastic film 900 may be disposed on the second surface (the lower surface in the drawing) of the base substrate layer (110 and 120). The elastic film 900 and the flexible film 200 may be separated from each other. The elastic film 900 may protect the flexible film 200, the flexible film 200 being exposed through the space between the first base substrate 110 and the second base substrate 120.

The bending operation of the display device will now be described by referring to FIG. 3.

Figure 3:
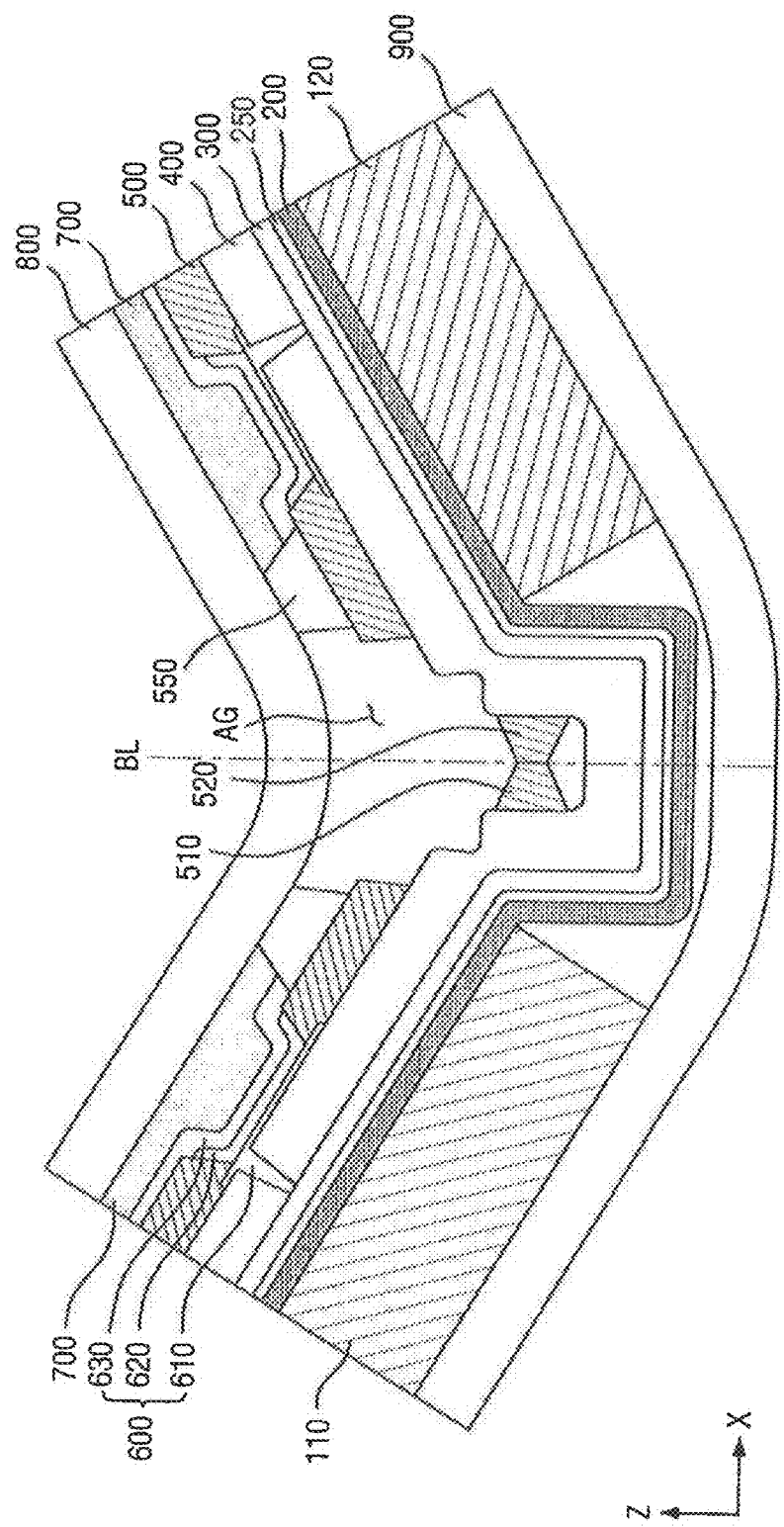
FIG. 3 is a cross-sectional view taken along line II-II' of FIG. 1, illustrating the display device of FIG. 1 in a bent state, according to an exemplary embodiment of the present invention.

FIG. 3 is a cross-sectional view taken along line II-II' of FIG. 1, illustrating the display device of FIG. 1 in a bent state, according to an exemplary embodiment of the present invention.

Referring to FIGS. 1 through 3, the display device may be bent when both the first base substrate 110 and the second base substrate 120 are bent upward (e.g., deflected in the third direction Z with respect to the XY plane) in the drawings with respect to the bending line BL. The display device may be bent such that a first surface (an upper surface in the drawings) of the encapsulation substrate 800 becomes concave (concave when looking at the display device through the encapsulation substrate 800). In this case, structural deformation may occur at a position overlapping the bent portion 202 of the flexible film 200. The air layer AG, disposed in an area overlapping the bent portion 202, may facilitate the bending of the display device.

It is understood that a plurality of first base substrates 110 and a plurality of second base substrate 120 may be repeatedly and alternately arranged in the first direction X. In addition, the bent portions 202 and 402, the first and second pattern portion 510 and 520, the bending line BL and the air layer AG may be disposed at each gap between a pair of neighboring first base substrate 110 and second base substrate 120, from among the plurality of repeatedly and alternately arranged first and second base substrates 110 and 120.

Hereinafter, a method of manufacturing a display device will be described.

FIGS. 4 to 10 are cross-sectional views illustrating a method of manufacturing a display device according to an exemplary embodiment of the present invention.

Figure 4:
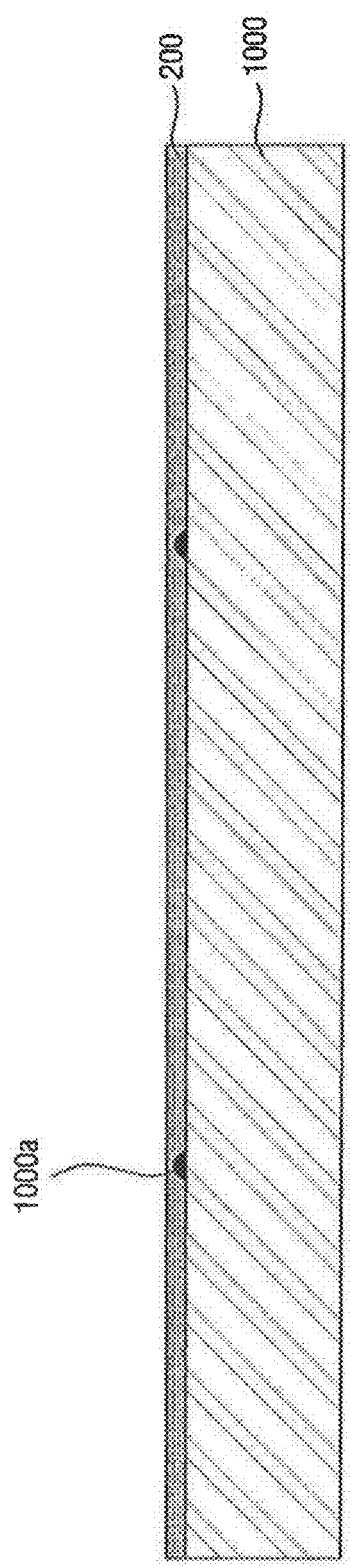
FIGS. 4 to 10 are cross-sectional views illustrating a method of manufacturing a display device according to an exemplary embodiment of the present invention.

Referring to FIG. 4, a carrier substrate 1000 is prepared, and one or more protruding patterns 1000a are formed on a first surface (an upper surface in the drawing) of the carrier substrate 1000. The carrier substrate 1000 may include a transparent plastic or glass. The protruding patterns 1000a may include, but are not limited to, a material such as silicon oxide.

A flexible film 200 is disposed on the carrier substrate 1000 and the protruding patterns 1000a. The flexible film 200 may be a transparent film, an opaque plastic film, etc. In an exemplary embodiment of the present invention, the placing of the flexible film 200 may include providing a composition for forming a flexible film on the first surface of the carrier substrate 1000, and firing and curing the composition. A second surface (a lower surface in the drawing) of the cured flexible film 200 may have one or more concave grooves formed at positions corresponding to those of the protruding patterns 1000a.

Figure 5:
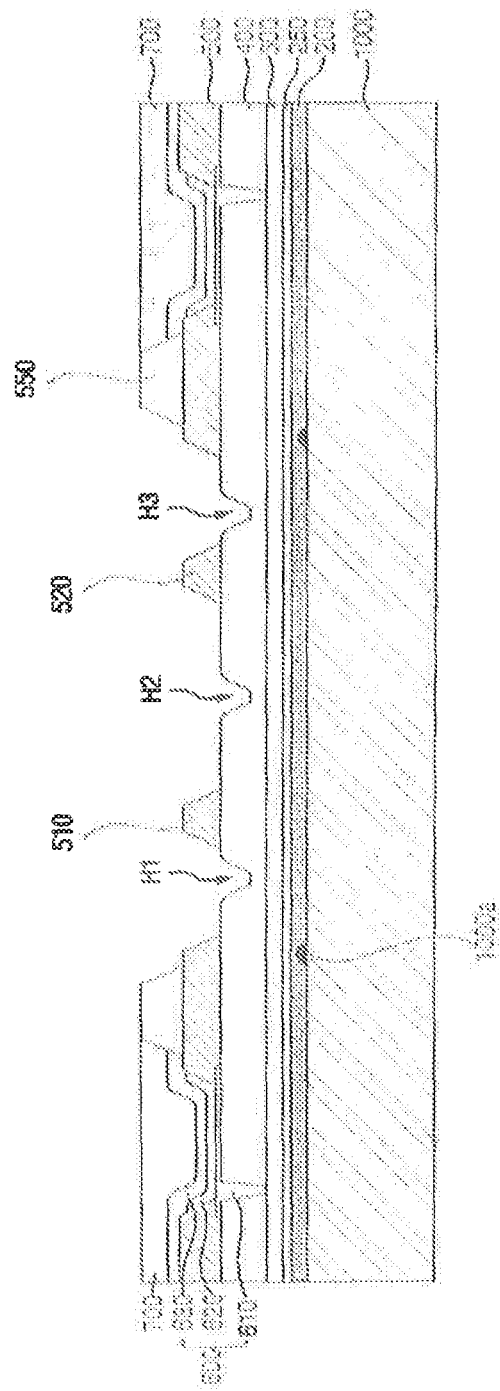

Referring to FIGS. 4 and 5, a barrier layer 250, a metal wiring layer 300, an interlayer insulating film 400, light emitting elements 600, a pixel defining layer 500, a first pattern portion 510, a second pattern portion 520, spacers 550 and an encapsulation layer 700 are sequentially formed on a first surface of the flexible film 200.

In an exemplary embodiment of the present invention, the interlayer insulating film 400 may have one or more grooves (H1 through H3). For example, a first groove H1 may be formed between the interlayer insulating film 400 and the first pattern portion 510, a second groove H2 may be formed between the first pattern portion 510 and the second pattern portion 520, and a third groove H3 may be formed between the second pattern portion 520 and the interlayer insulating film 400. The first groove H1, the second groove H2 and the third groove H3 may extend in the second direction Y of FIG. 1 and may be separated from each other in the first direction X.

In addition, the pixel defining layer 500, the first pattern portion 510, and the second pattern portion 520 may include the same material and may be formed through an integral process.

It is to be understood that the barrier layer 250, the metal wiring layer 300, the interlayer insulating film 400, the light emitting elements 600, the pixel defining layer 500, the first pattern portion 510, the second pattern portion 520, the spacers 550 and the encapsulation layer 700 may be similar to or identical to their corresponding elements as described above with reference to FIG. 2.

Figure 6:
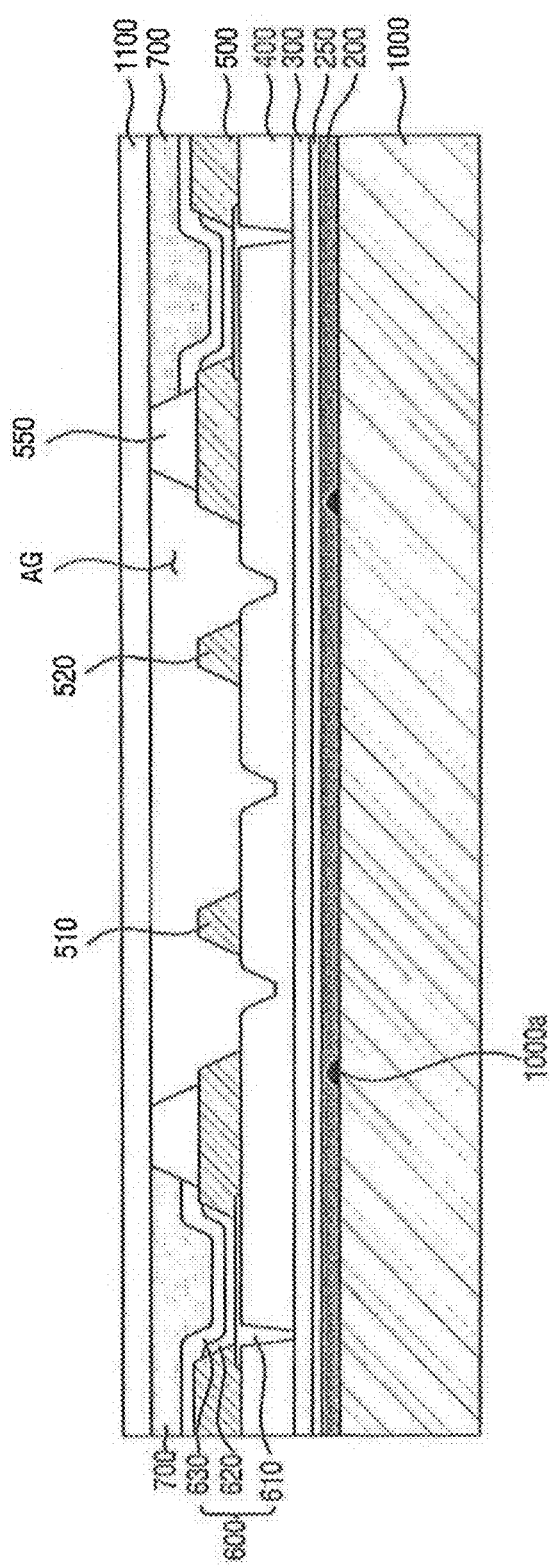
Figure 7:
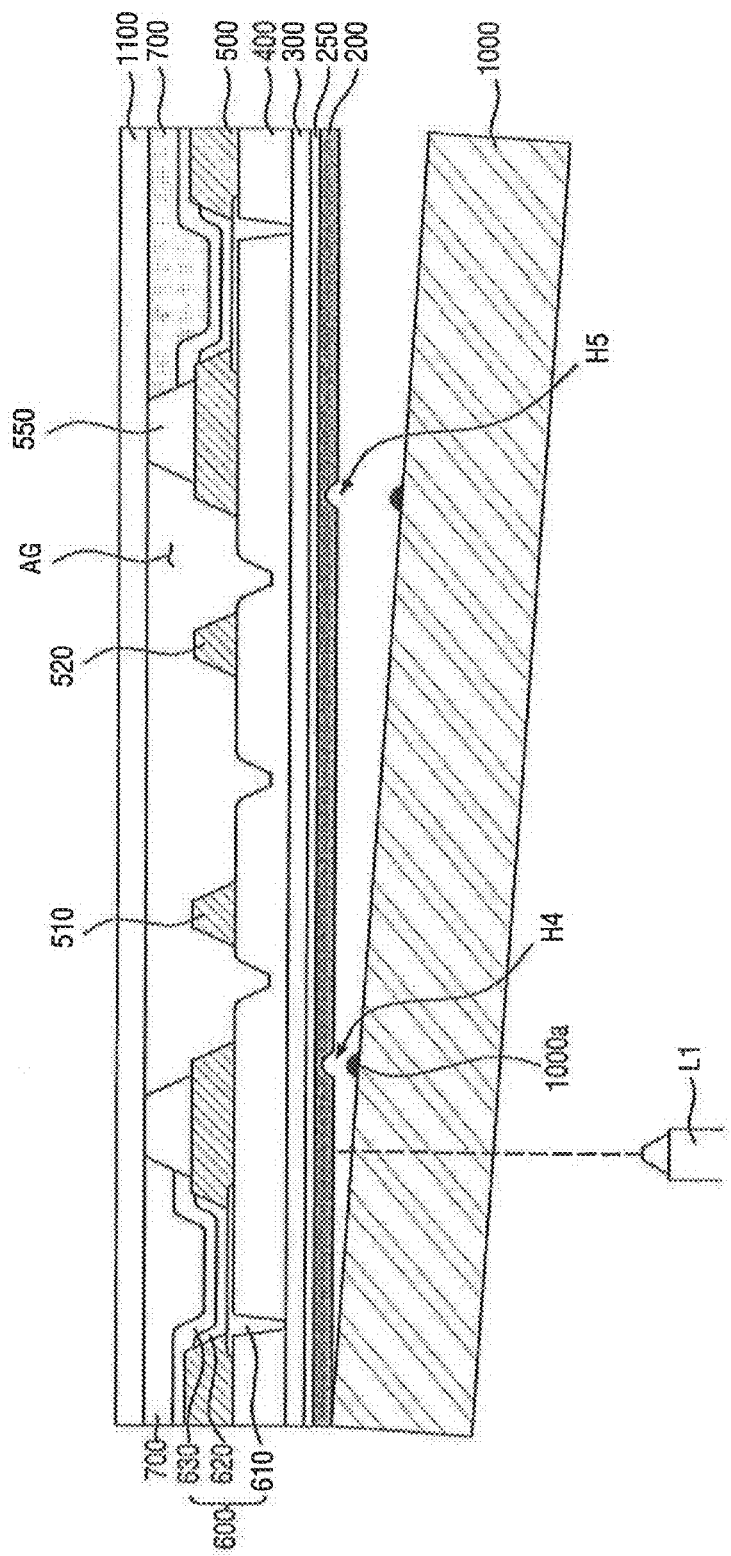
Figure 8:
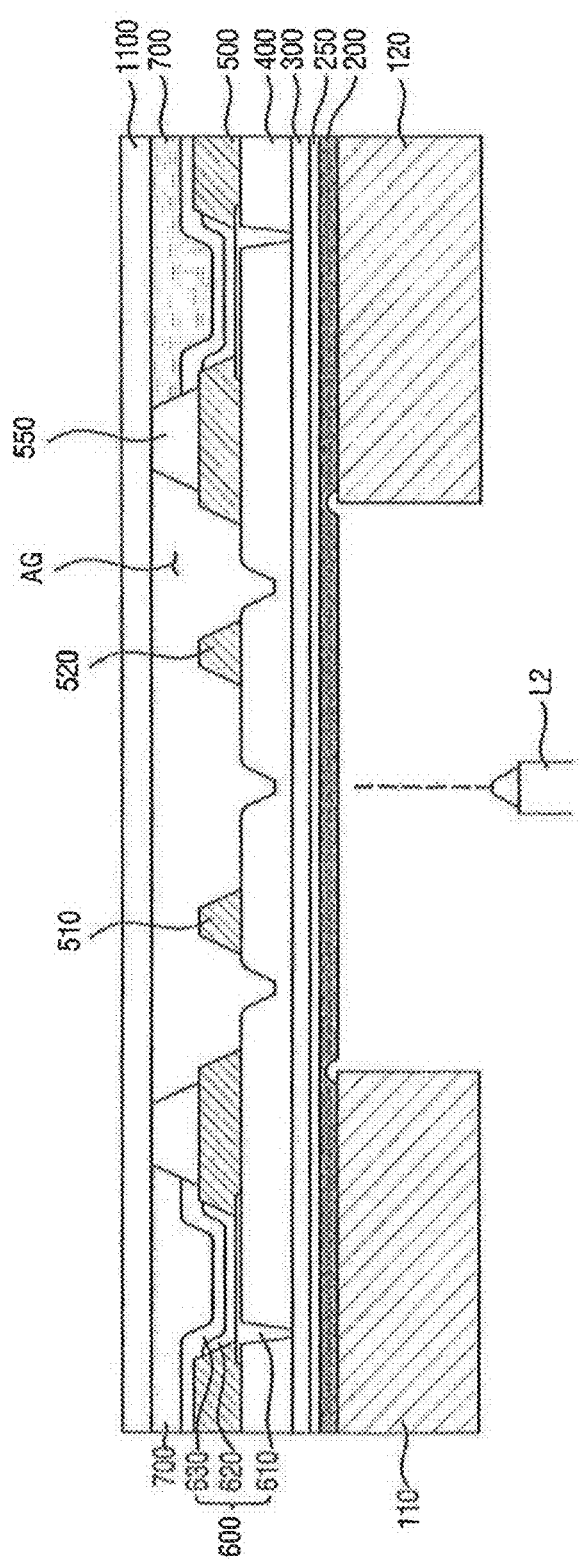
Figure 9:
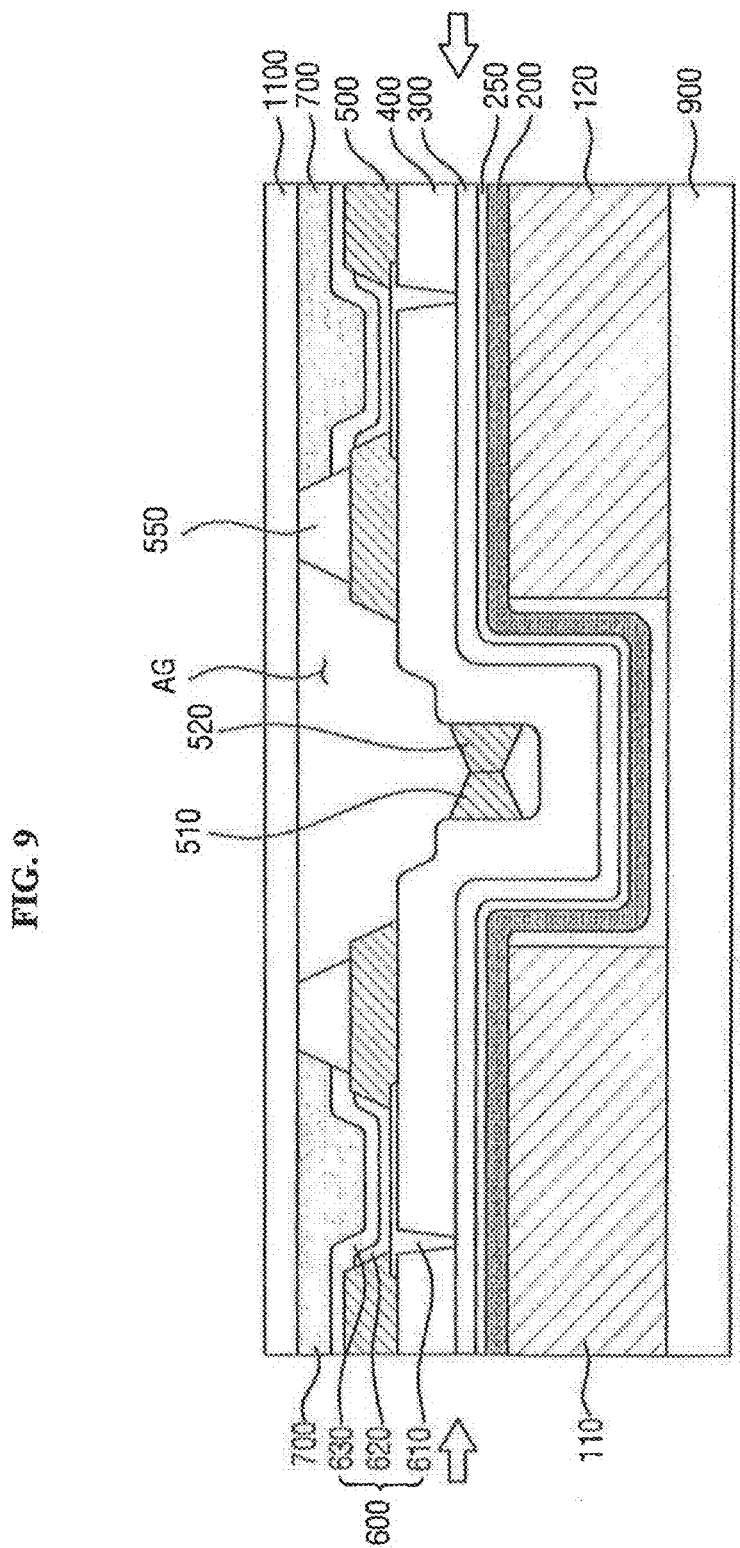
Figure 10:
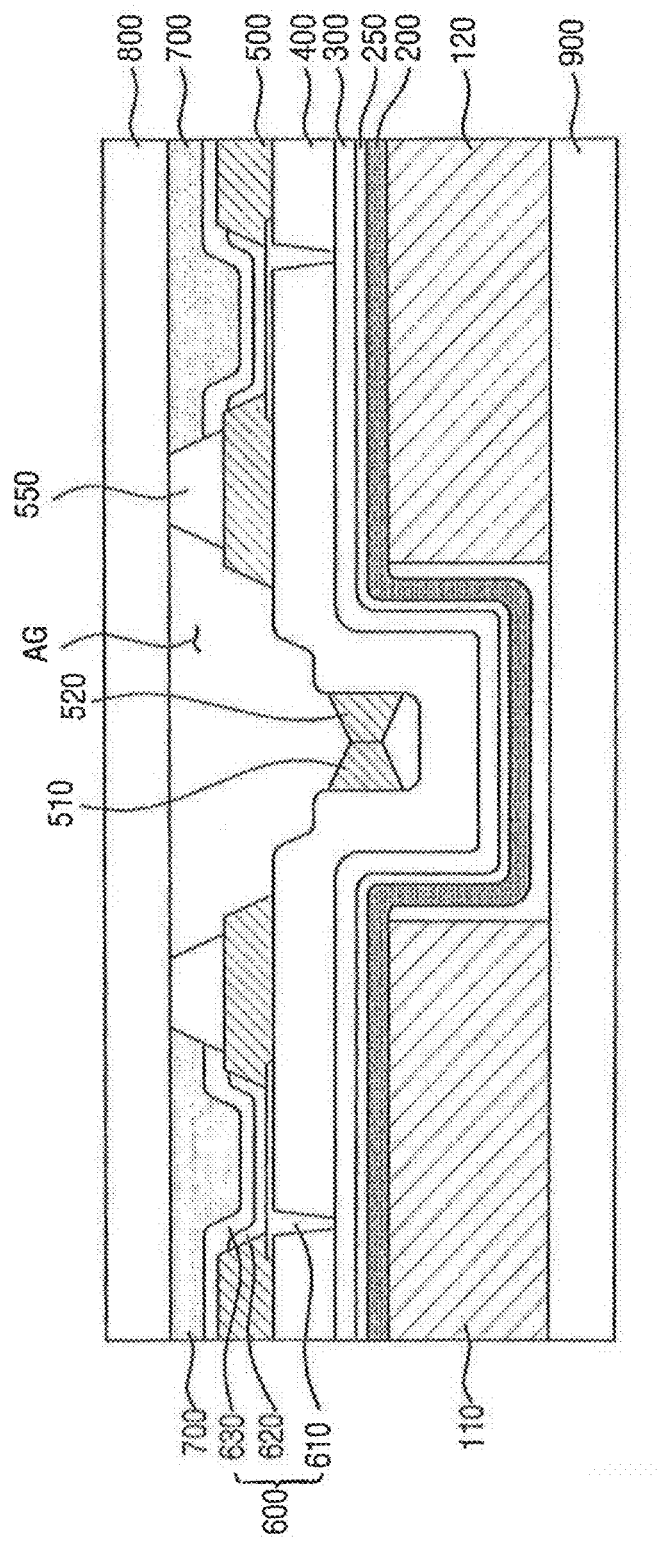

Referring to FIGS. 4 through 6, a shrinkable film 1100 is disposed on the light emitting elements 600. For example, the shrinkable film 1100 may be disposed to contact the encapsulation layer 700 and the spacers 550. In addition, an air layer AG may be formed in a space surrounded by the shrinkable film 1100, the spacers 550, the pixel defining layer 500, and the interlayer insulating film 400. In an exemplary embodiment of the present invention, the disposing of the shrinkable film 1100 may include disposing a uniaxially stretched film in the first direction X (a horizontal direction in the drawings).

Referring to FIGS. 4 through 7, the carrier substrate 1000 and the protruding patterns 1000a are removed. In an exemplary embodiment of the present invention, the removing of the carrier substrate 1000 may include peeling off the carrier substrate 1000 by directing a laser light L1 between the carrier substrate 1000 and the flexible film 200.

In addition, the carrier substrate 1000 and the protruding patterns 1000a may be removed simultaneously. However, in an exemplary embodiment of the present invention, the protruding patterns 1000a may be removed after the carrier substrate 1000 is removed. After the removal of the carrier substrate 1000 and the protruding patterns 1000a, a fourth groove H4 and a fifth groove H5 may be formed in the second surface (the lower surface in the drawings) of the flexible film 200.

Referring to FIGS. 4 through 8, a base substrate layer (110 and 120), having an opening, is disposed on the second surface of the flexible film 200. The base substrate layer (110 and 120) includes a first base substrate 110 and a second base substrate 120 separated from the first base substrate 110 in the first direction X (the horizontal direction in the drawings). For example, in the placing of the base substrate layer (110 and 120) on the second surface of the flexible film 200, at least part of the flexible film 200 may be exposed through the opening.

In an exemplary embodiment of the present invention, the forming of the base substrate layer (110 and 120), having the opening on the second surface of the flexible film 200, may include forming a base film on the second surface of the flexible film 200 and forming an opening by using a laser light L2. In an exemplary embodiment of the present invention, the forming of the base substrate layer (110 and 120), having the opening on the second surface of the flexible film 200, may include attaching the first base substrate 110 to the second surface of the flexible film 200 and attaching the second base substrate 120 to the second surface of the flexible film 200.

Referring to FIGS. 4 through 9, the shrinkable film 1100 is shrunk. The shrinking of the shrinkable film 1100 may include forming a bent portion in one or more portions of each of the flexible film 200, the barrier layer 250, the metal wiring layer 300 and the interlayer insulating film 400 by using a shrinking force of the shrinkable film 1100 and by inserting at least part of the bent portion of each of the flexible film 200, the barrier layer 250 and the metal wiring layer 300 into a space between the first base substrate 110 and the second base substrate 120.

In an exemplary embodiment of the present invention, the first through fifth grooves H1 through H5, formed in a first surface of the interlayer insulating film 400 and the second surface of the flexible film 200, may facilitate the bending of flexible film 200. Thus, the forming of the bent portion of the flexible film 200, the barrier layer 250 and the metal wiring layer 300 may be facilitated, in addition, the first pattern portion 510 and the second pattern portion 520 may be brought into contact with each other.

Referring to FIGS. 4 through 10, the shrunk shrinkable film 1100 is removed, and an encapsulation substrate 800 is disposed on the light emitting elements 600. For example, the encapsulation substrate 800 may be disposed to contact the encapsulation layer 700 and the spacers 550. In addition, the air layer AG may be disposed in a space surrounded by the encapsulation substrate 800, the spacers 550, the pixel defining layer 500, and the interlayer insulating film 400.

An elastic film 900 may be disposed on a second surface of the base substrate layer (110 and 120) to complete the display device. The elastic film 900 may be similar to or identical to the elastic film 900 described above with reference to FIG. 2.

In a display device, according to an exemplary embodiment of the present invention, an opening is formed in a base substrate layer, and bent portions of components, the components including a flexible film) are inserted into the opening. Therefore, the display device may be bent with small structural deformation by an external force. As a result, the display device may have a structure that may perform reliably under repeated bending.

In addition, even when the thickness of the display device is changed by the placement of additional components in an upper part and/or a lower part of the display device, the position of a neutral plane in which a bending line is located can be maintained. Thus, a disconnection or a breakage of components of the display device may be reduced or prevented.

Further, the bending line may be located in a display area of the display device, for example, between two adjacent pixels PX. Therefore, an image may be displayed in the vicinity of the bending, line without damage to a light emitting element.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. A display device comprising:
   a base substrate layer comprising a first base substrate and a second base substrate separated from the first base substrate in a first direction;
   a flexible film disposed on a first surface of the base substrate layer; and
   one or more light emitting elements disposed on a first surface of the flexible film,
   wherein the flexible film comprises a flat portion and a bent portion, and
   wherein the bent portion is inserted into a space between the first base substrate and the second base substrate.

2. The display device of claim 1, wherein the base substrate layer further comprises a plurality of first base substrates and a plurality of second base substrates alternatively arranged in the first direction, wherein each first substrate of the plurality of first base substrates is separated from a neighboring second base substrate of the plurality of second base substrates in the first direction by a first gap,
   wherein the flexible film further includes a plurality of flat portions and a plurality of bent portions,
   wherein, for each pair of neighboring first and second base substrates, from among the plurality of first and second base substrates, the flexible film includes a flat portion of the plurality of flat portions disposed on at least one of the pair of neighboring first and second base substrates, and a bent portion of the plurality of bent portions disposed at the first gap, and
   wherein the first gap extends in a second direction intersecting the first direction.

3. The display device of claim 2, further comprising an encapsulation substrate disposed on the one or more light emitting elements, and
   wherein a bending line, along which at least the flexible film is bent, extends in the second direction,
   wherein the bending line overlaps a bent portion of the plurality of bent portions, and
   wherein a first surface of the encapsulation substrate becomes concave when the display device is bent along the bending line.

4. The display device of claim 1, wherein a first surface of the first base substrate and a first surface of the second base substrate are substantially coplanar, and the bent portion is convex.

5. The display device of claim 4, wherein the flexible film further comprises a third flat portion, wherein the bent portion is disposed between the first and third flat portions,
   wherein the bent portion comprises:
   a first inclined portion connected to the flat portion, the first inclined portion having a first slope with respect to the first direction;
   a second inclined portion connected to the third flat portion, the second inclined portion having a second slope with respect to the first direction, the second slope being different from the first slope; and
   a third portion disposed between the first and second inclined portions,
   wherein at least part of a first surface of the first inclined portion faces a sidewall of the first base substrate.

6. The display device of claim 5, wherein a second surface of the first inclined portion, opposite to the first surface of the first inclined portion, at least partially overlaps a first surface of the second inclined portion.

7. The display device of claim 5, wherein the third portion is disposed between the first surface of the base substrate layer and a second surface of the base substrate layer, the first and second surfaces of the base substrate layer being opposite to each other.

8. The display device of claim 4, wherein the flexible film comprises polyimide.

9. The display device of claim 4, wherein the bent portion comprises a "U"-shaped structure.

10. The display device of claim 1, wherein each of the one or more light emitting elements comprises a lower electrode disposed on the first surface of the flexible film, a light emitting layer disposed on the lower electrode and an upper electrode disposed on the light emitting layer, the display device further comprising:
- an interlayer insulating film disposed between the one or more light emitting elements and the flexible film; and
- a pixel defining layer disposed on a first surface of the interlayer insulating film, the pixel defining layer exposing at least part of the lower electrode of each of the one or more light emitting elements.

11. The display device of claim 10, wherein the interlayer insulating film comprises a flat portion and a bent portion,
   wherein the bent portion of the interlayer insulating film is inserted into the space between the first base substrate and the second base substrate,
   wherein the bent portion of the interlayer insulating film comprises:
   - a first inclined portion connected to the flat portion, the first inclined portion having a first slope with respect to the first direction;
   - a second inclined portion connected to the third flat portion, the second inclined portion having a second slope with respect to the first direction, the second slope being different from the first slope; and
   - a third portion disposed between the first and second inclined portions,
   the display device further comprising:
   - a first pattern portion disposed on the first inclined portion of the interlayer insulating film; and
   - a second pattern portion disposed on the second inclined portion of the interlayer insulating film.

12. The display device of claim 11, wherein each of the first pattern portion and the second pattern portion includes a material that is included in the pixel defining layer.

13. The display device of claim 10, further comprising:
- a metal wiring layer disposed between the flexible film and the one or more light emitting elements;
- a barrier layer disposed between the metal wiring layer and the flexible film;
- an interlayer insulating film disposed between the metal wiring layer and the one or more light emitting elements;
- an encapsulation layer disposed on the one or more light emitting elements; and
- a spacer disposed on the pixel defining layer,
   wherein a neutral plane is located in the metal wiring layer at a position of the metal wiring layer that overlaps the space between the first base substrate and the second base substrate.

14. The display device of claim 13, further comprising an encapsulation substrate disposed on the spacer and contacting the spacer, wherein an air layer is disposed in a space surrounded by the encapsulation substrate, the spacer, the pixel defining layer and the interlayer insulating film.

15. The display device of claim 13, further comprising an elastic film disposed on a second surface of the base substrate layer, the first and second surfaces of the base substrate layer being opposite to each other.

* * * * *